(12) United States Patent
Jung et al.

(10) Patent No.: US 12,431,438 B2
(45) Date of Patent: Sep. 30, 2025

(54) SEMICONDUCTOR DEVICE AND METHOD FOR PARTIAL EMI SHIELDING

(71) Applicant: STATS ChipPAC Pte. Ltd., Singapore (SG)

(72) Inventors: JinHee Jung, Incheon (KR); ChangOh Kim, Incheon (KR)

(73) Assignee: STATS ChipPAC Pte. Ltd., Singapore (SG)

(*) Notice: Subject to any disclaimer, the term of this patent is extended or adjusted under 35 U.S.C. 154(b) by 543 days.

(21) Appl. No.: 17/820,957

(22) Filed: Aug. 19, 2022

(65) Prior Publication Data

US 2024/0063137 A1 Feb. 22, 2024

(51) Int. Cl.
| | |
|---|---|
| *H01L 23/552* | (2006.01) |
| *H01L 21/48* | (2006.01) |
| *H01L 23/00* | (2006.01) |
| *H01L 23/498* | (2006.01) |
| *H01L 25/16* | (2023.01) |

(52) U.S. Cl.
CPC ........ *H01L 23/552* (2013.01); *H01L 21/4817* (2013.01); *H01L 21/4853* (2013.01); *H01L 23/49816* (2013.01); *H01L 23/49838* (2013.01); *H01L 24/16* (2013.01); *H01L 25/162* (2013.01); *H01L 25/165* (2013.01); *H01L 2224/16225* (2013.01); *H01L 2924/16151* (2013.01); *H01L 2924/1616* (2013.01); *H01L 2924/3025* (2013.01)

(58) Field of Classification Search
CPC ............. H01L 23/552; H01L 23/49816; H01L 23/19838; H01L 23/3128; H01L 23/49811; H01L 23/3107; H01L 23/481; H01L 23/488; H01L 23/535; H01L 23/3121; H01L 21/4817; H01L 21/4853; H01L 21/561; H01L 21/56; H01L 21/50; H01L 21/60; H01L 21/565; H01L 21/78; H01L 24/16; H01L 25/162; H01L 25/165; H01L 25/04; H01L 25/105; H01L 25/0655; H01L 25/16; H01L 25/50; H01L 2224/16225; H01L 2924/16151; H01L 2924/1616; H01L 2924/3025; H01L 2225/1023; H01L 2225/1052; H05K 1/181

See application file for complete search history.

(56) References Cited

U.S. PATENT DOCUMENTS

| | | | |
|---|---|---|---|
| 7,851,894 B1 * | 12/2010 | Scanlan | ................ H01L 23/552 |
| | | | 257/E23.116 |
| 8,247,889 B2 | 8/2012 | Liao et al. | |
| 9,129,954 B2 | 9/2015 | Yen et al. | |

(Continued)

*Primary Examiner* — Marlon T Fletcher
*Assistant Examiner* — Christina A Sylvia
(74) *Attorney, Agent, or Firm* — Brian M. Kaufman; Robert D. Atkins; PATENT LAW GROUP: Atkins and Associates, P.C.

(57) ABSTRACT

A semiconductor device includes a substrate. An electrical component is disposed over the substrate. An encapsulant is deposited over the electrical component. A vertical interconnect structure is disposed in the encapsulant. A shielding layer is formed over the encapsulant and vertical interconnect structure. A groove is formed in the shielding layer around the vertical interconnect structure. A portion of the shielding layer remains over the vertical interconnect structure as a contact pad.

17 Claims, 14 Drawing Sheets

(56) References Cited

U.S. PATENT DOCUMENTS

2014/0252595 A1* 9/2014 Yen ................. H01L 23/498
                                              257/737
2015/0348936 A1* 12/2015 Lin ................... H01L 24/19
                                              257/659
2020/0411445 A1* 12/2020 Chen ............... H01L 23/5386

* cited by examiner

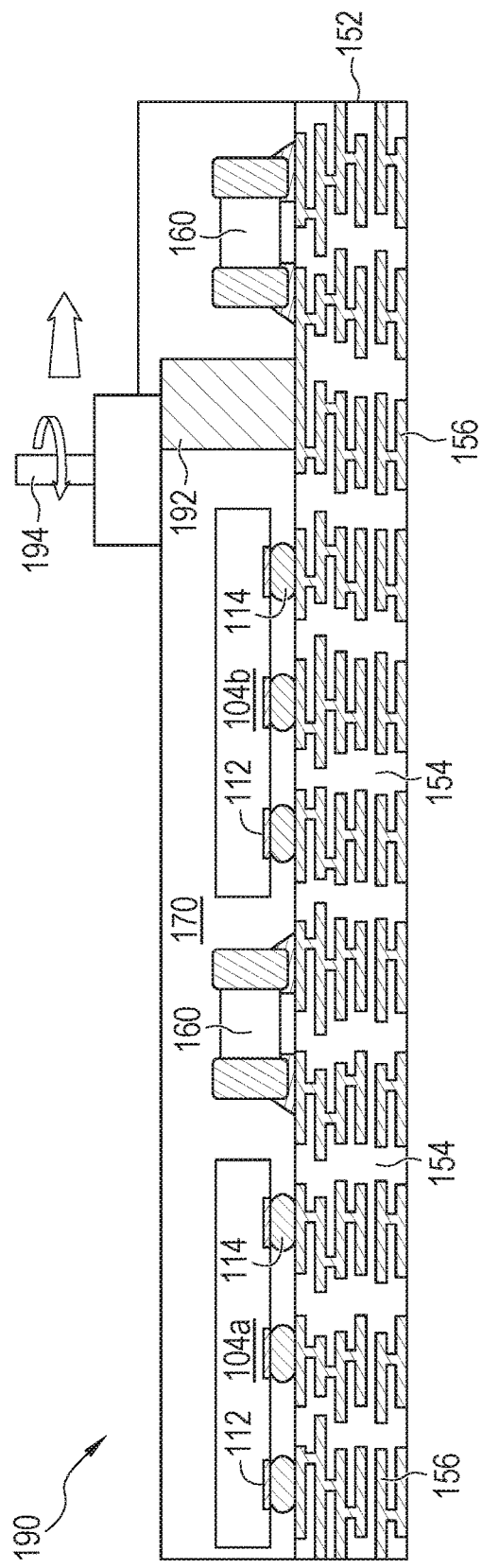
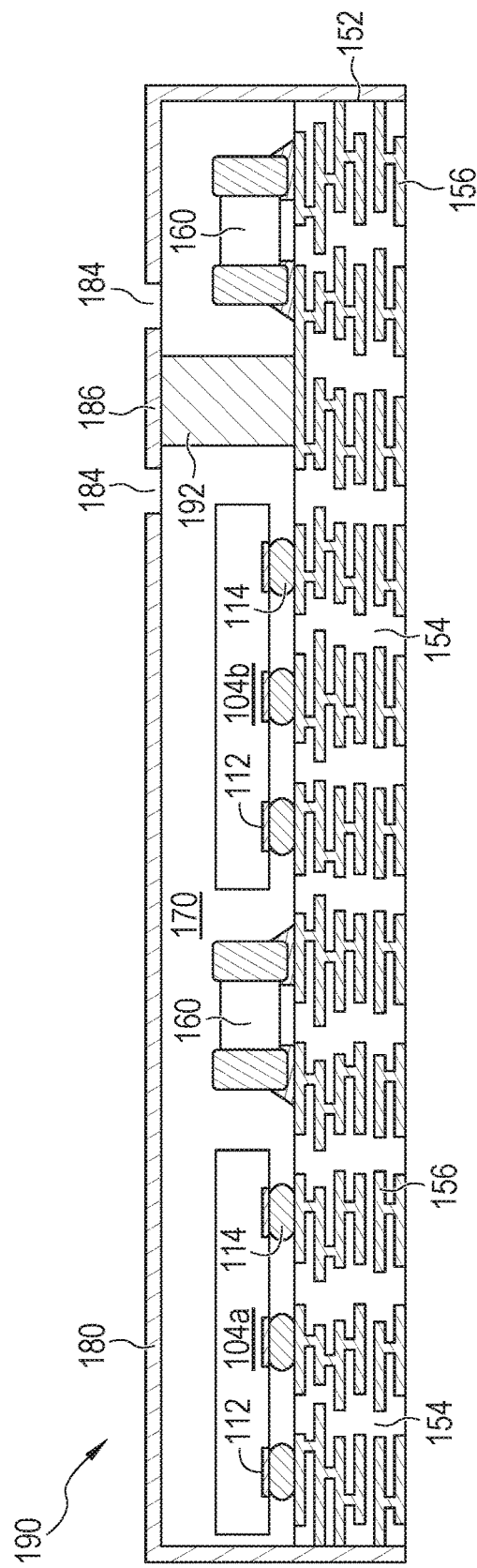

SEMICONDUCTOR DEVICE AND METHOD FOR PARTIAL EMI SHIELDING

FIELD OF THE INVENTION

The present invention relates in general to semiconductor devices and, more particularly, to a semiconductor device and method for partial electromagnetic interference (EMI) shielding.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. High-speed analog circuits, e.g., radio frequency (RF) filters, or digital circuits also generate interference.

Conductive layers are commonly formed over semiconductor packages to shield electronic parts within the package from EMI and other interference. Shielding layers absorb EMI before the signals reach semiconductor die and discrete components within the package, which might otherwise cause malfunction of the device. Shielding layers are also formed over packages with components that are expected to generate EMI to protect nearby devices.

One problem with prior art methods of semiconductor package shielding is that the shielding may block out desirable radiation, such as transmission to and from an antenna within the package. Partial EMI shielding can be used, leaving a portion of the semiconductor package devoid of the shielding layer. Partial EMI shielding protects part of the package while leaving another part exposed. The part of the package that remains exposed from the shielding layer may have an antenna or a physical terminal or connector that an electrical conductor can be physically attached to for wired communication.

Masking with a metal or plastic tape is typically used to leave a portion of a semiconductor package free of the shielding layer. However, partial shielding with a mask presents many manufacturing challenges. For instance, applying the tape is difficult due to the tight design rules involved. Therefore, a need exists for an improved semiconductor device and method for partial EMI shielding.

BRIEF DESCRIPTION OF THE DRAWINGS

FIGS. 3a-3d illustrate an alternative process flow using a metal can for vertical interconnect;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices. The terms "semiconductor die" and "die" are used interchangeably.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
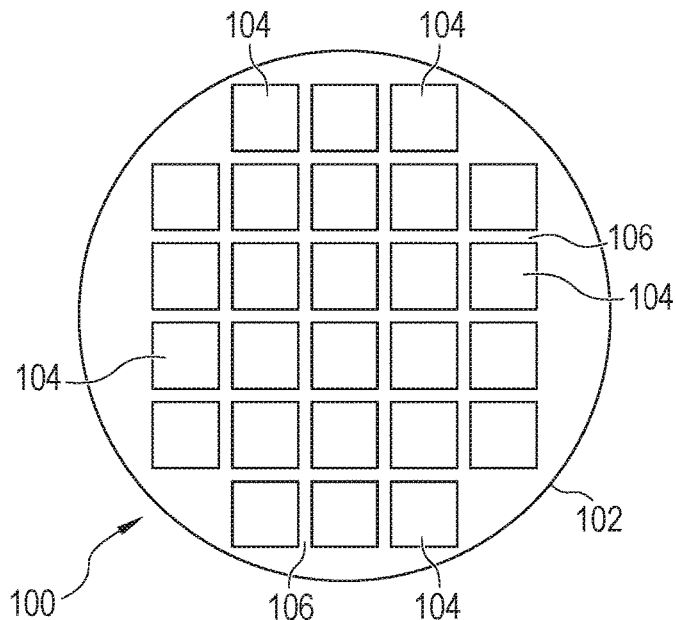
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
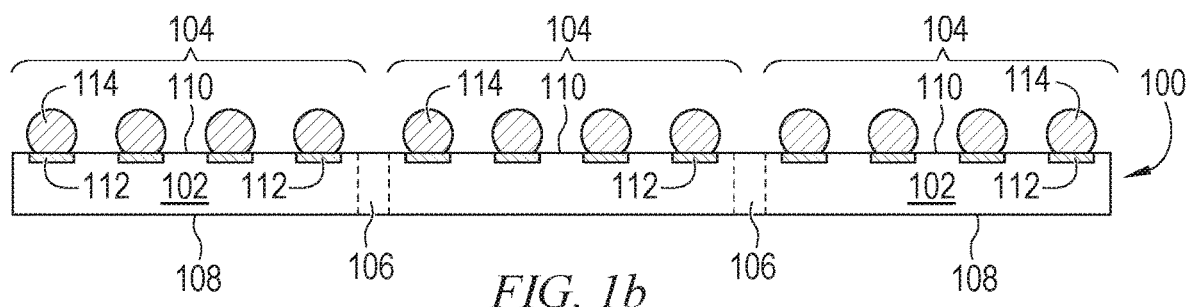

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
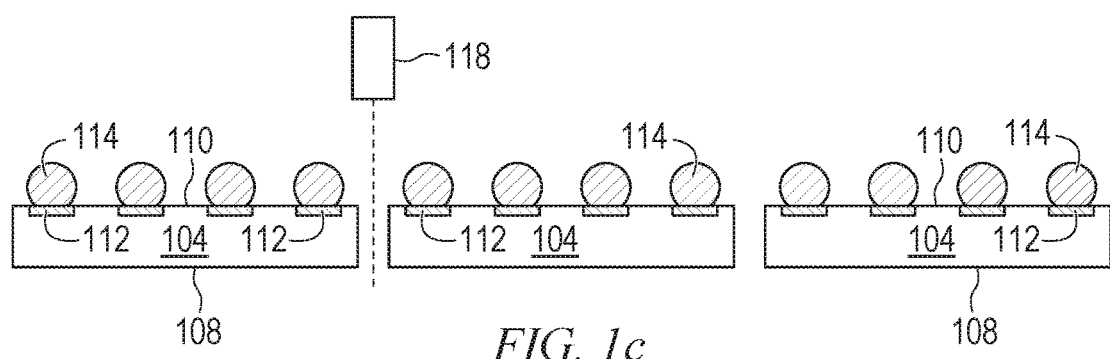

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or unit (KGD/KGU) post singulation.

Figure 2A:
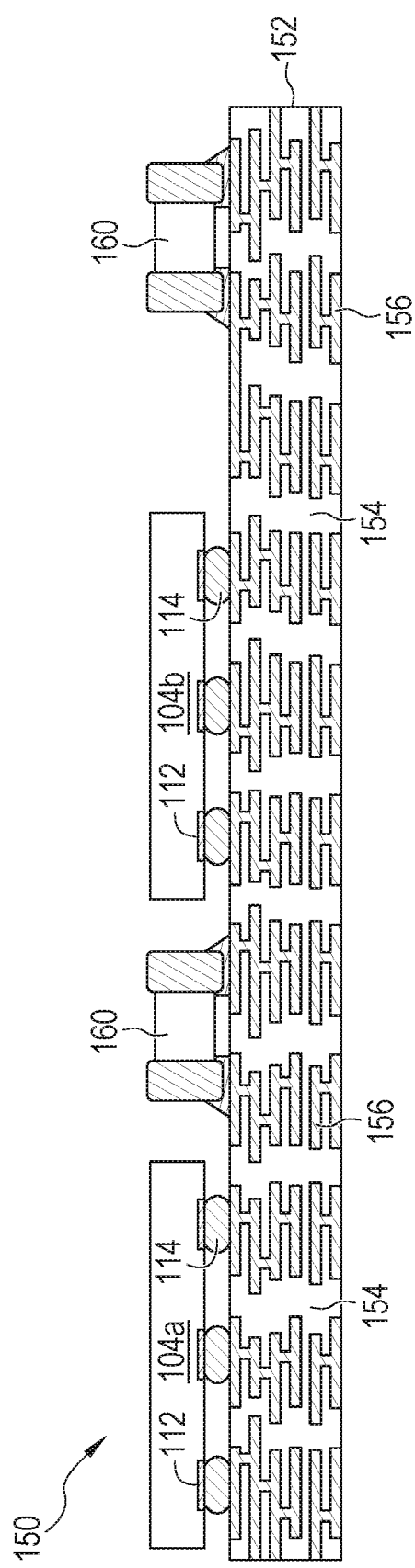
FIGS. 2a-2g illustrate forming EMI shielding with conductors extending through openings of the shielding.

FIGS. 2a-2g illustrate a process of forming a shielded semiconductor package 150 with conductive paths routed through the shielding. In some embodiments, package 150 is a system-in-package (SiP) module. FIG. 2a shows a partial cross-sectional view of a substrate 152. While only a single substrate 152 is shown, hundreds or thousands of substrates are commonly processed on a common carrier, using the same steps described herein for a single unit but performed en masse. Substrate 152 could also start out as a single large substrate for multiple units, which are singulated from each other during or after the manufacturing process.

Substrate 152 includes one or more insulating layers 154 interleaved with one or more conductive layers 156. Insulating layer 154 is a core insulating board in one embodiment, with conductive layers 156 patterned over the top and bottom surfaces, e.g., a copper-clad laminate substrate. Conductive layers 156 also include conductive vias electrically coupled through insulating layers 154. Substrate 152 can include any number of conductive and insulating layers interleaved over each other. A solder mask or passivation layer can be formed over either side of substrate 152. Any suitable type of substrate or leadframe is used for substrate 152 in other embodiments.

Semiconductor package 150 in FIG. 2a has two semiconductor die 104a-104b and discrete components 160 mounted thereon, as well as any other discrete active or passive components, semiconductor die, or other components desired for the intended functionality of the package. Solder bumps 114 are reflowed between conductive layers 156 and semiconductor die 104 to mechanically and electrically connect the die to substrate 152. Any type and number of components can be mounted onto either the top surface of substrate 152 as illustrated in FIG. 2a, the bottom surface, or both, and also embedded within the substrate in any suitable order and configuration. Semiconductor die 104 and discrete components 160 as illustrated are merely representative. Any suitable type, number, and configuration of components can be used.

Figure 2B:
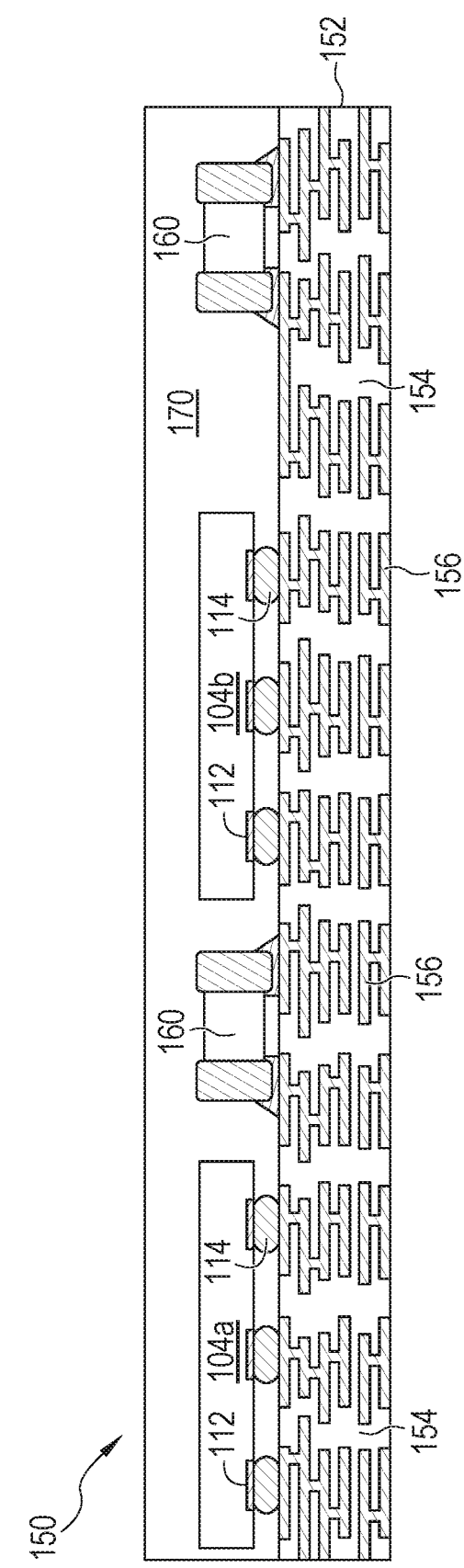

After mounting of semiconductor die 104, discrete components 160, and any other desired electrical components onto substrate 152, the components are encapsulated by encapsulant or molding compound 170 in FIG. 2b. Encapsulant 170 is deposited over substrate 152, semiconductor die 104, and discrete components 160 using paste printing, compressive molding, transfer molding, liquid encapsulant molding, vacuum lamination, spin coating, or another suitable applicator. Encapsulant 170 can be polymer composite material, such as epoxy resin, epoxy acrylate, or polymer with or without a filler. Encapsulant 170 is non-conductive, provides structural support, and environmentally protects the semiconductor device from external elements and contaminants. Encapsulant 170 completely covers top and side surfaces of semiconductor die 104 and discrete components 160. Encapsulant 170 fills any gaps between substrate 152 and semiconductor die 104 or discrete components 160 unless a separate underfill is used. Encapsulant 170 is backgrinded to reduce a thickness of the encapsulant if desired.

Figure 2C:
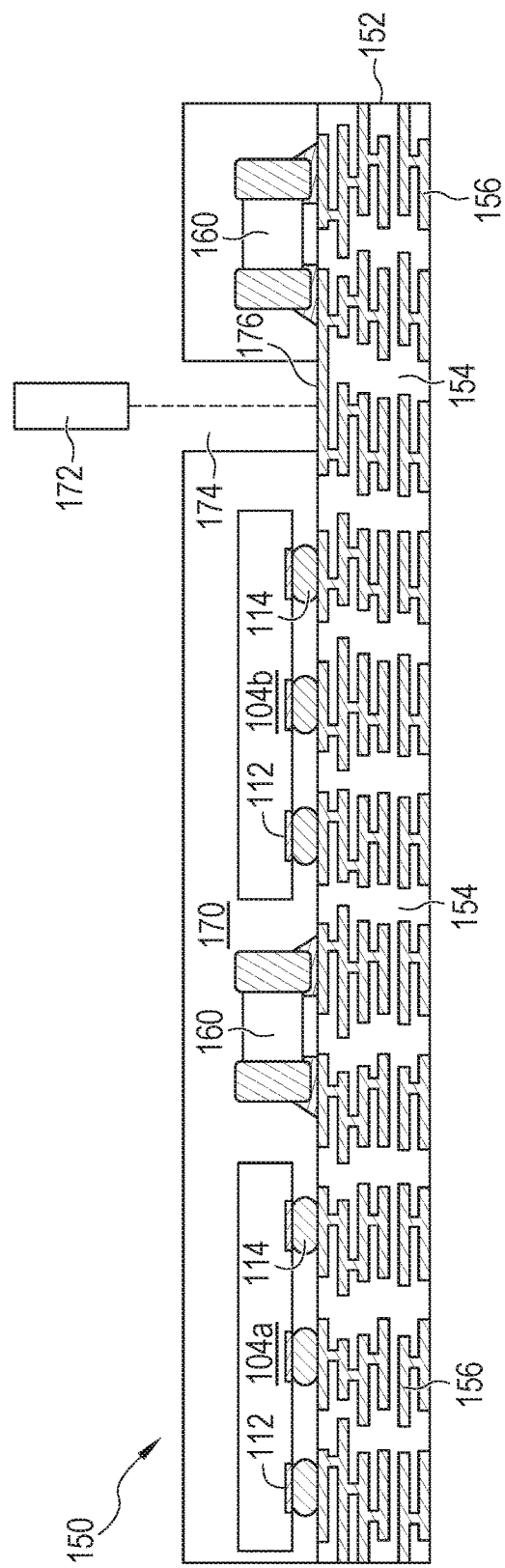

In FIG. 2c, a mechanical drill, chemical etching, or laser 172 is used to form an opening 174 through encapsulant 170. Any suitable through-hole formation method is used in other embodiments. Opening 174 is formed completely through encapsulant 170 to expose a contact pad 176 of conductive layer 156. In some embodiments, one or more additional conductive layers are formed over substrate 152 where opening 174 is to be formed prior to depositing encapsulant 170 to act as an etch stop layer and improve electrical contact with a subsequently formed conductive via.

Figure 2D:
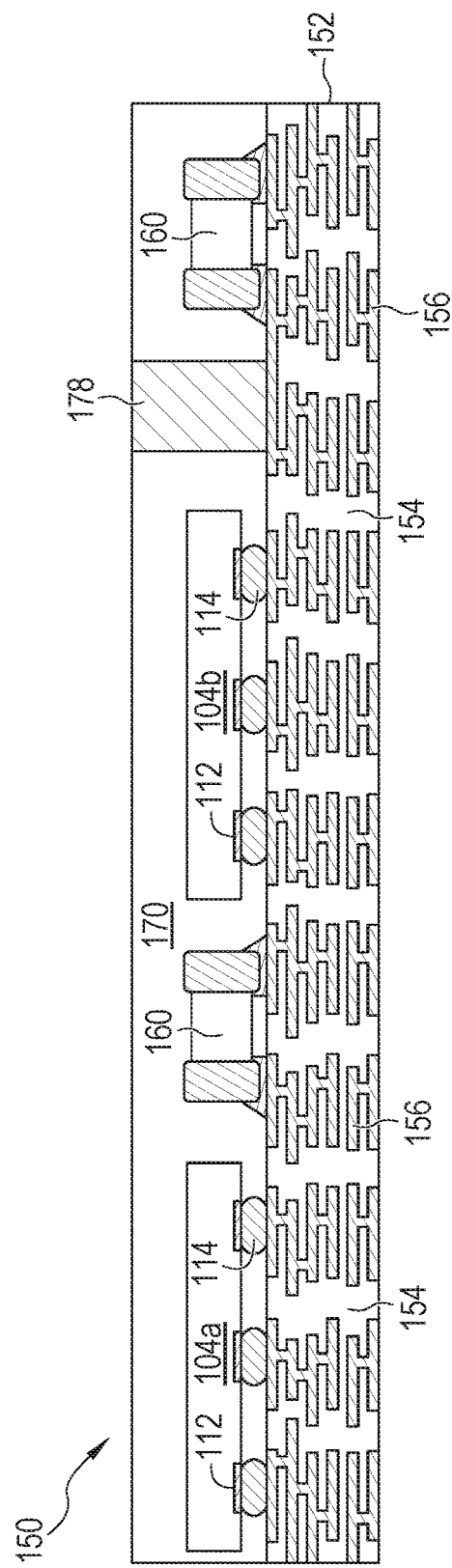

In FIG. 2d, a conductive material is deposited into opening 174 and on contact pad 176 to form a vertical interconnect structure or conductive via 178. Conductive via 178 is formed using any suitable metal deposition technique, e.g., chemical vapor deposition, physical vapor deposition, other sputtering methods, spraying, dispensing, or plating. The sputtered material can be copper, steel, aluminum, gold, combinations thereof, or any other suitable material. Conductive material can be overfilled relative to opening 174, such that the conductive material is deposited onto the top of encapsulant 170 and then removed by grinding, etching, or another suitable means. The top surface of conductive via 178 is typically made coplanar to the top surface of encapsulant 170. Conductive via 178 provides electrical connection from the top of encapsulant 170 to substrate 152.

Figure 2E:
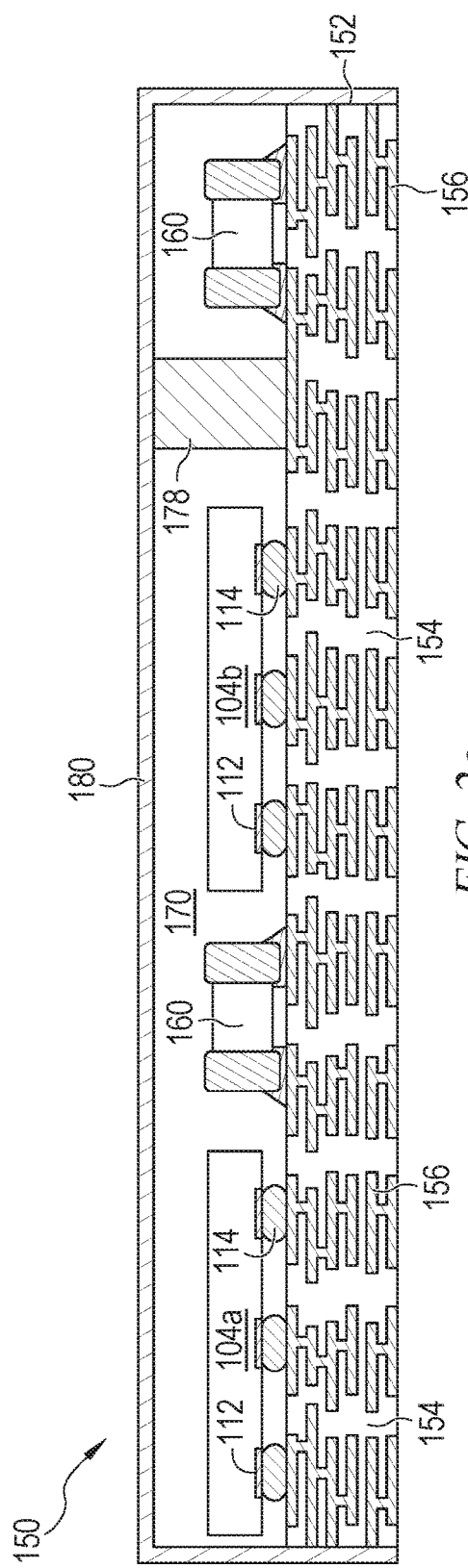

In FIG. 2e, shielding layer 180 is formed over package 150 using any suitable metal deposition technique, e.g., chemical vapor deposition, physical vapor deposition, other sputtering methods, spraying, or plating. The sputtered material can be copper, steel, aluminum, gold, combinations thereof, or any other suitable material. Shielding layer 180 completely covers exposed surfaces of encapsulant 170, substrate 152, and conductive via 178. If semiconductor package 150 is formed as a strip of units, the strip is optionally singulated prior to forming shielding layer 180 to allow the shielding layer to be deposited down the side surfaces of the package. Conductive layer 156 can be exposed at sides of substrate 152 to connect shielding layer 180 to ground through the substrate. Shielding layer 180 is formed directly on and physically contacting conductive via 178.

Figure 2F:
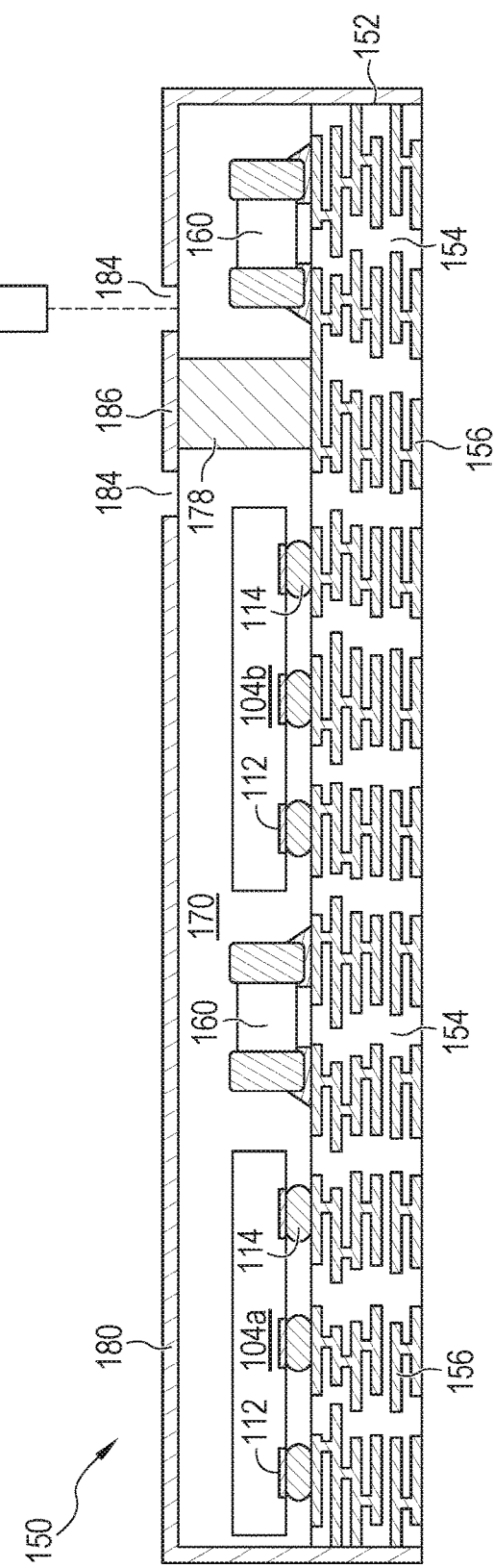

In FIG. 2*f*, a laser 182 is used to form a groove 184 through shielding layer 180 around the footprint of conductive via 178. Laser 182 can be the same laser as, or different from, laser 172 used to form opening 174. Chemical etching, mechanical etching, or any other suitable process is used in other embodiments. Groove 184 is formed completely through shielding layer 180, exposing encapsulant 170 and leaving a portion of the shielding layer isolated as contact pad 186. Contact pad 186 is a portion of shielding layer 180 remaining on conductive via 178, and thereby electrically coupled to conductive layer 156 of substrate 152.

Figure 2G:
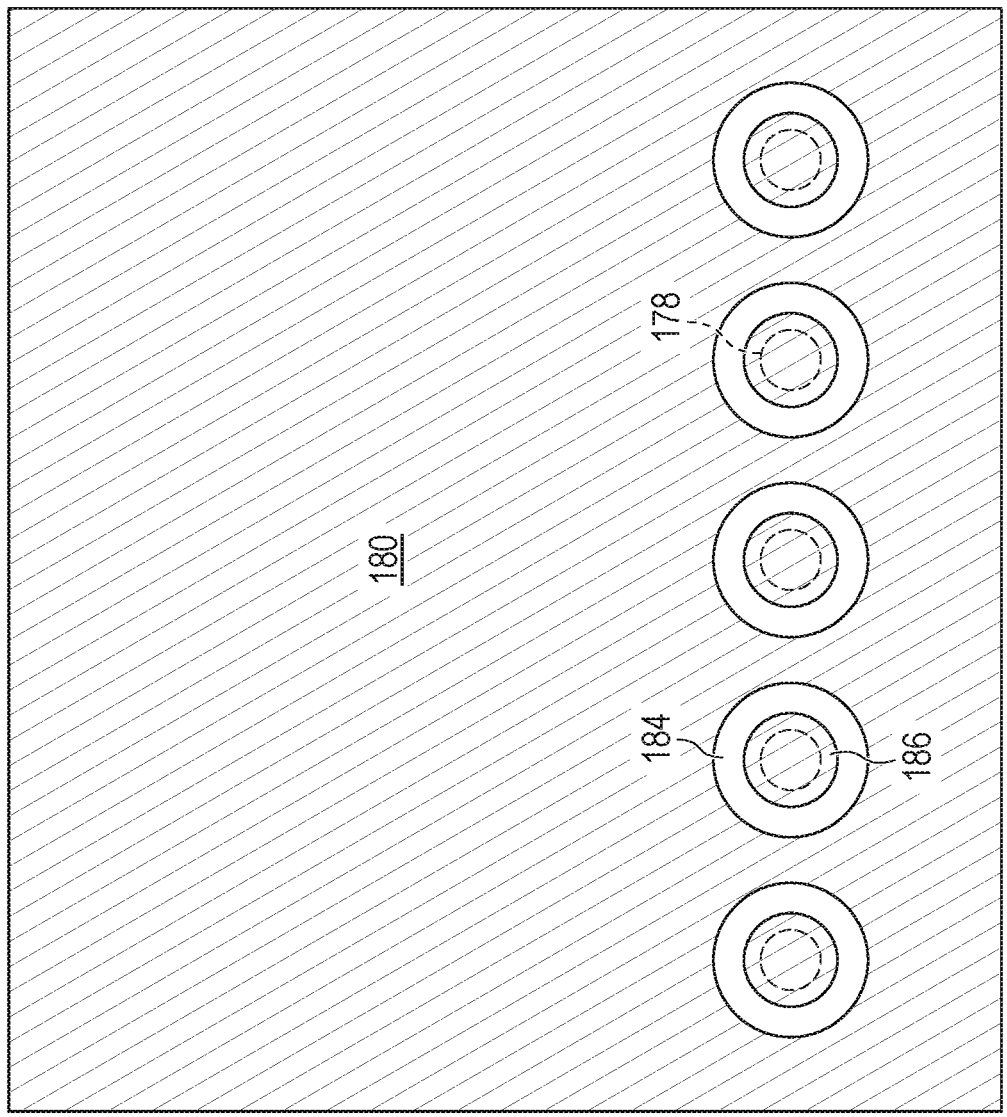

FIG. 2*g* shows a plan view with a plurality of contact pads 186 formed to allow electrical communication from the top surface of package 150 to the components within the package. Package 150 has exposed contact pads 186 for subsequent electrical connection of additional components without requiring partial molding or partial shielding of the package. Package 150 fulfills a major use of partial molding and partial shielding, i.e., having contact pads exposed from the top of the package, without the need to mask the molding or shielding steps. Package 150 remains almost entirely shielded other than the area of grooves 184 while still allowing electrical connections through shielding layer 180. While FIG. 2*g* shows a single row of five contact pads 186, any suitable layout can be used as needed for the intended use, e.g., multiple rows or a square of contact pads. Package 150 can be used as a package-on-package bottom package by mounting another semiconductor package onto the top surface of package 150 and electrically coupling the package to contact pads 186.

Figures 3A, 3B:
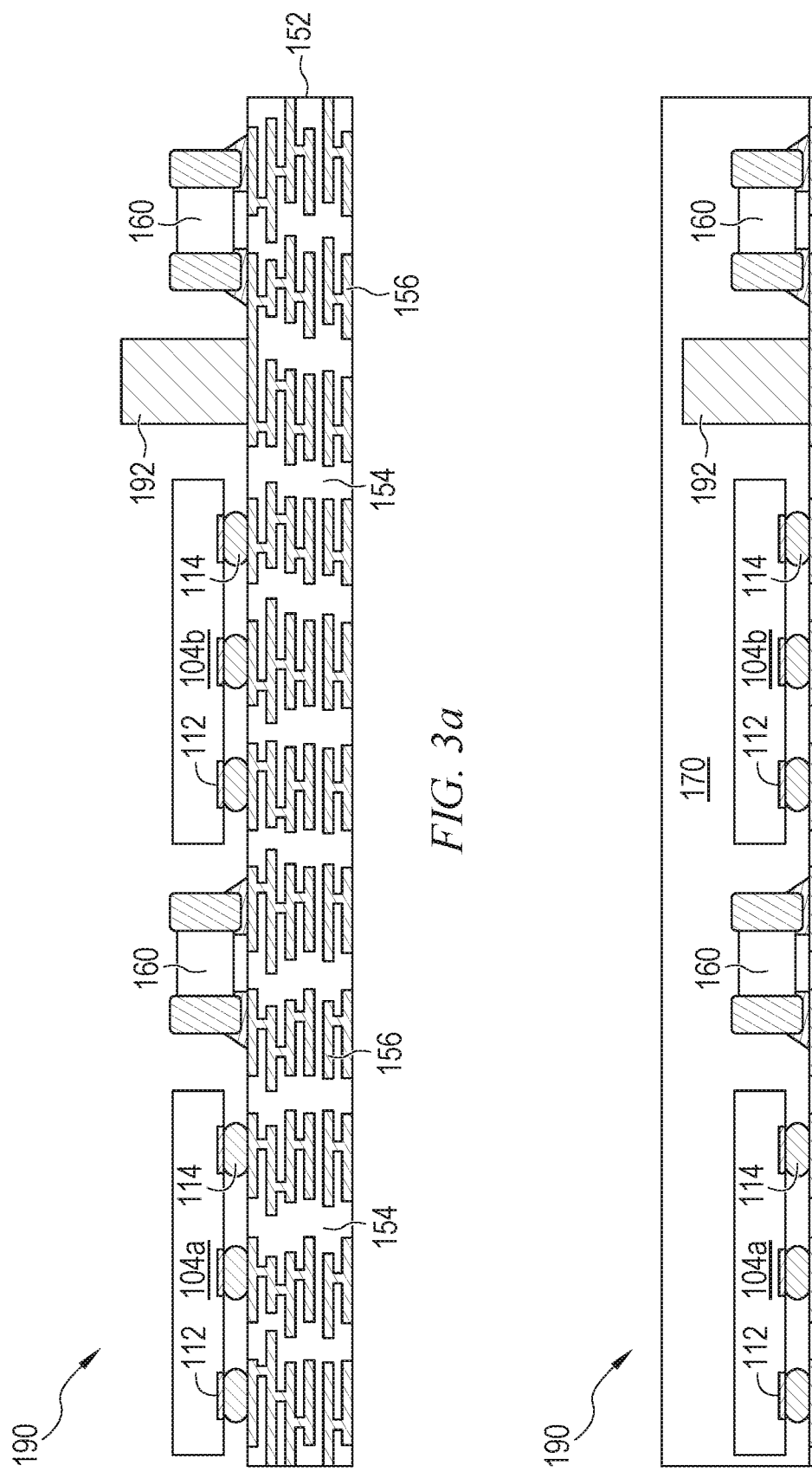

FIGS. 3*a*-3*d* illustrate an alternative embodiment with semiconductor package 190 being formed. In FIG. 3*a*, a conductive pillar 192 is mounted onto substrate 152 along with semiconductor die 104 and discrete components 160. Conductive pillars 192 are preformed from aluminum, copper, steel, titanium, gold, other metals, or a combination or alloy thereof. Conductive pillars 192 are formed separately and then picked and placed onto substrate 152. Conductive pillars 192 can be formed by molding, by cutting a sheet or block of material into the desired size and shape, or by any other suitable means. In other embodiments, conductive pillars 192 are formed directly on substrate 152 using a photoresist layer as a mask that is removed. Conductive pillar 192 is a metal can in some embodiments.

Encapsulant 170 is deposited over substrate 150 in FIG. 3*b* as described above. Encapsulant 170 completely covers conductive pillar 192. In other embodiments, a molding method is used that leaves the top surface of conductive pillar 192 exposed from encapsulant 170, e.g., film-assisted molding. A mechanical grinder 194, chemical etching, chemical-mechanical planarization, or another suitable means is used in FIG. 3*c* to reduce a thickness of encapsulant 170 and expose the top surface of conductive pillar 192. In some embodiments, a top portion of conductive pillar 192 is also removed.

Shielding layer 180, groove 184, and contact pad 186 are formed in FIG. 3*d* as described above. Conductive pillar 192 provides an electrical connection from conductive layer 156 of substrate 152 to contact pad 186 on the top surface of package 190.

Figure 4A:
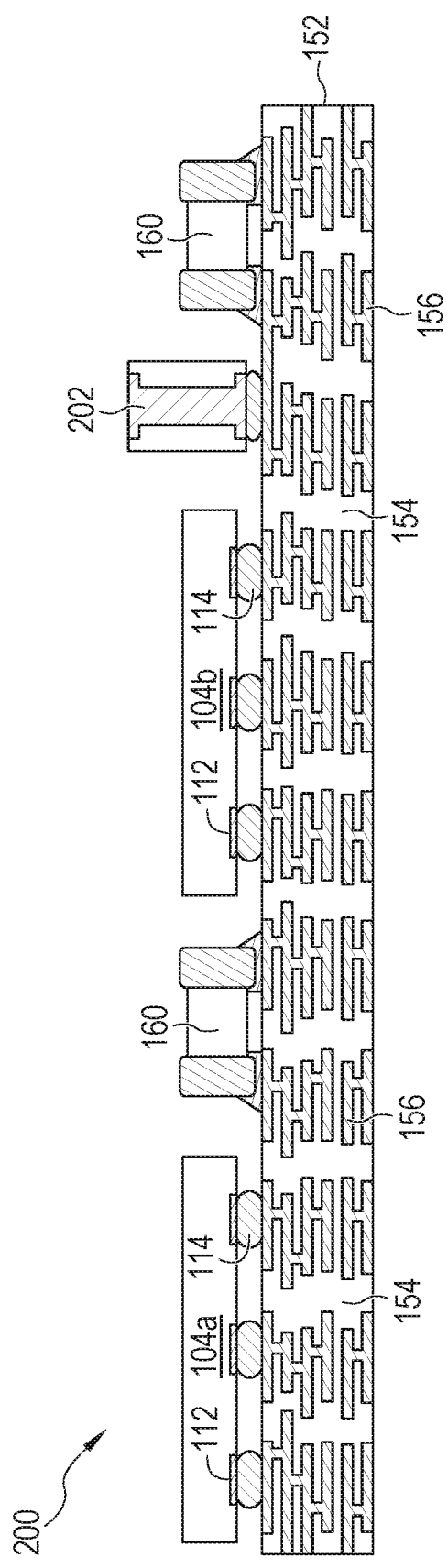
FIGS. 4a and 4b illustrate using PCB units for vertical interconnect.
Figure 4B:
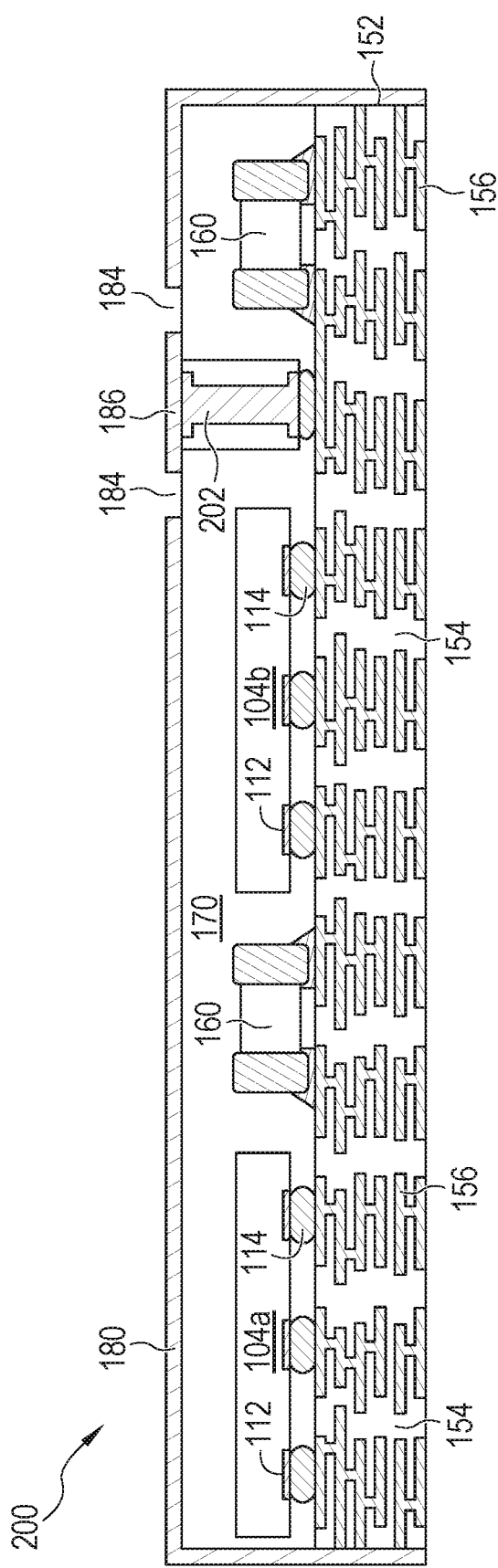

FIGS. 4*a* and 4*b* illustrate a similar embodiment with semiconductor package 200 having an e-bar or PCB unit 202 for vertical interconnect. PCB unit 202 is a small printed circuit board, structured similarly to substrate 152, with at least an insulating base material, contact pads on top and bottom surfaces, and a conductive via through the insulating base material coupling the top and bottom contact pads to each other. In FIG. 4*a*, PCB unit 202 is mounted onto substrate 152 with solder paste, a solder bump, conductive adhesive, or another suitable means. PCB unit 202 can have multiple rows of conductive vias and contact pads for additional signal paths. Multiple PCB units 202 are used per package in other embodiments. In FIG. 4*b*, encapsulant 170, shielding layer 180, groove 184, and contact pad 186 are formed as described above. Contact pad 186 can optionally be completely removed, and the top contact pads of PCB unit 202 is used for subsequent electrical connection.

Figure 5A:
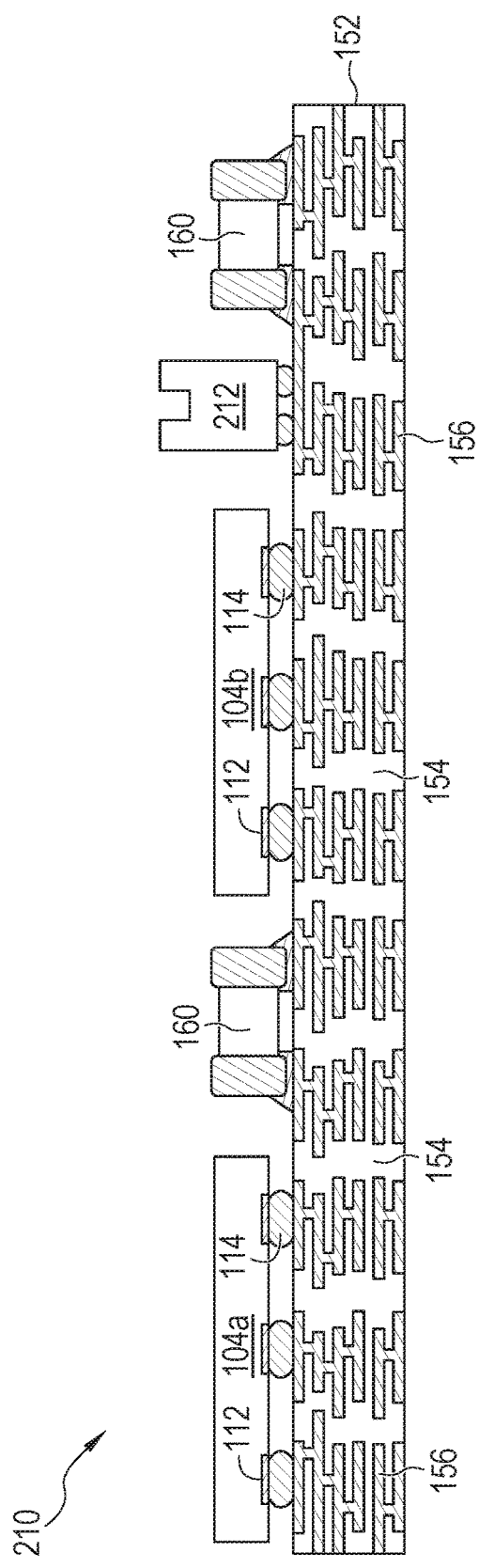
FIGS. 5a and 5b illustrate using a connector.
Figure 5B:
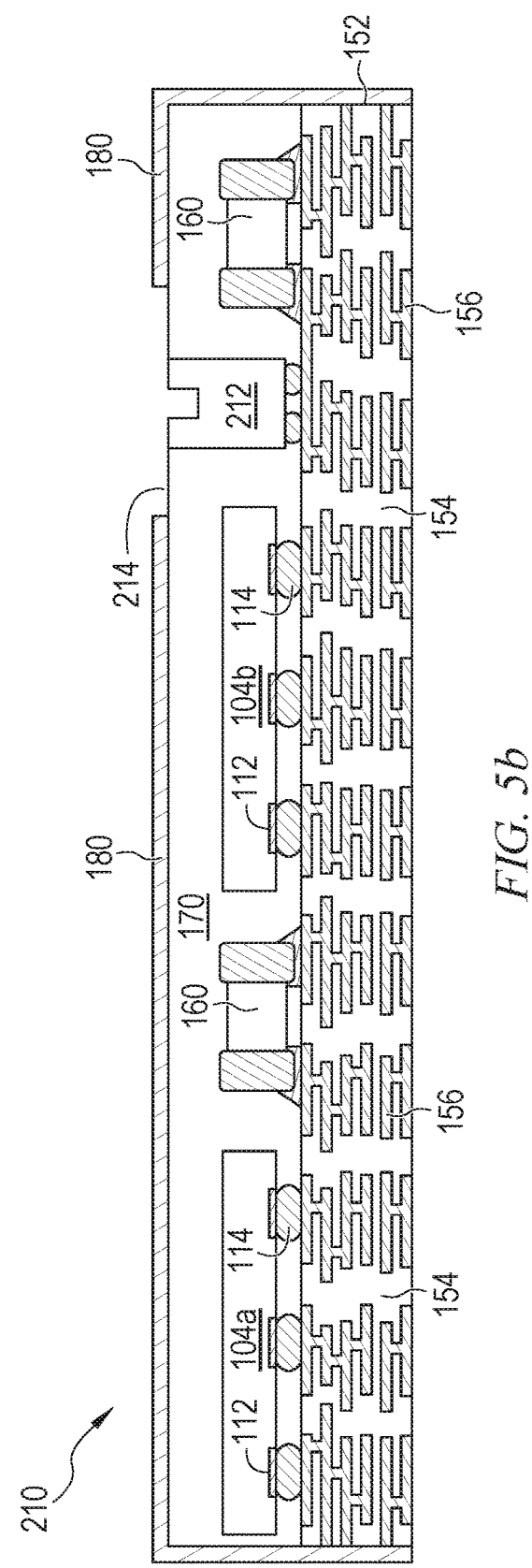

FIGS. 5*a* and 5*b* illustrate an embodiment with semiconductor package 210 having a board-to-board (B2B) or other type of connector 212 mounted on substrate 152 in FIG. 5*a*. Encapsulant 170 and shielding layer 180 are formed in FIG. 5*b* as described above. An opening 214 is formed to completely remove shielding layer 180 over connector 212. Opening 214 can be considered a groove around connector 212, as the opening extends around the connector in plan view. Connector 212 exposed from package 210 allows another corresponding connector to attach to the package, e.g., by snapping into connector 212, without needing a portion of shielding layer 180 to be left as a contact pad.

Figure 6A:
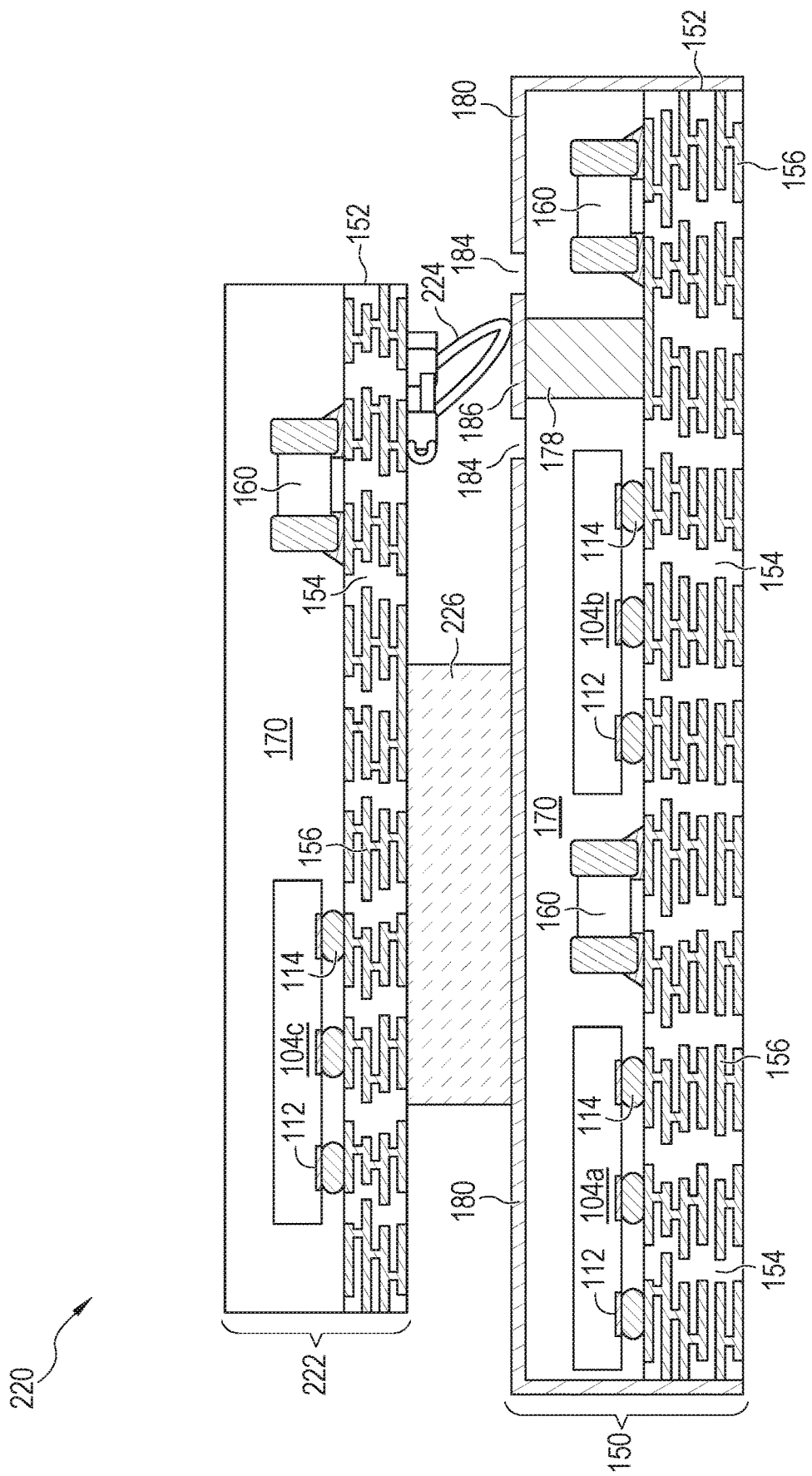
FIGS. 6a-6c illustrate stacking semiconductor packages.
Figure 6B:
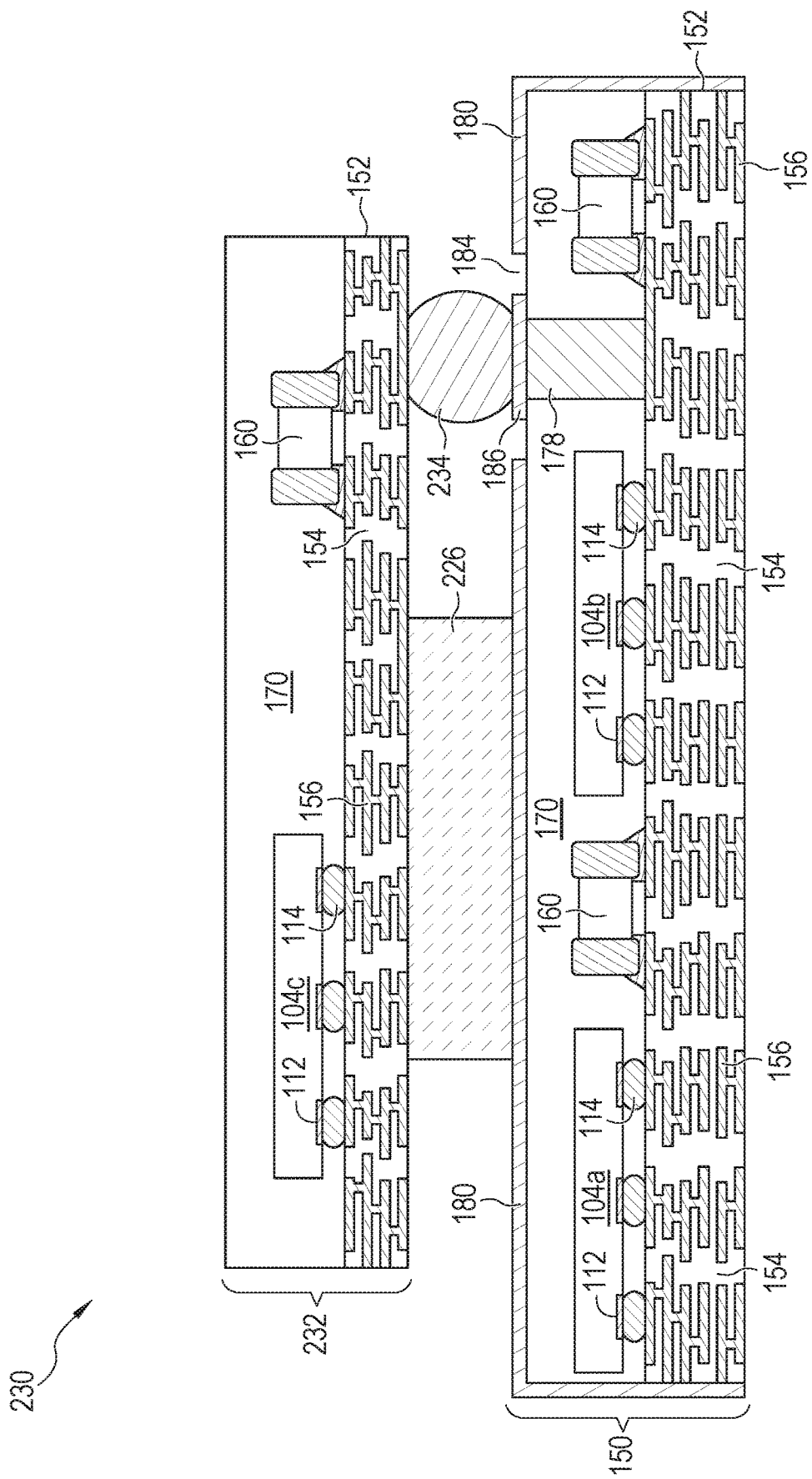
Figure 6C:
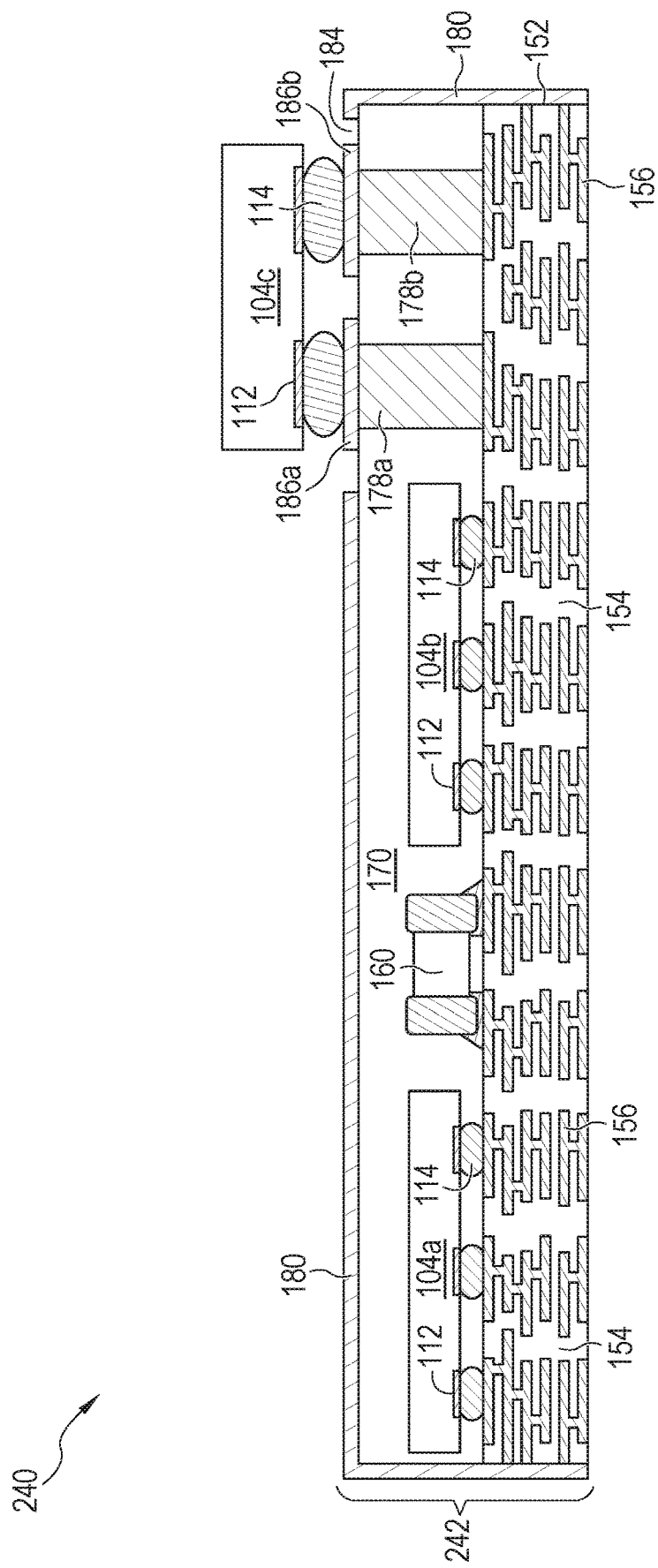

FIGS. 6*a*-6*c* illustrate forming package-on-package (PoP) systems by stacking top packages onto package 150. While package 150 is specifically illustrated, any of the above-described packages can operate as a bottom package of a PoP. In FIG. 6*a*, a top package 222 is mounted onto bottom package 150 using an adhesive standoff 226 or another suitable means. Top package 222 is structured similarly to bottom package 150, including a similar substrate 152. In other embodiments, any type of semiconductor package or device is mounted on package 150 and coupled to contact pads 186.

Top package 222 includes a spring pin 224 mounted onto the bottom of the package to electrically connect the components within package 222 to package 150. Spring pin 224 is formed from an electrically conductive material and applies a mechanical force against contact pad 186 to establish a reliable electrical connection between the packages. A plurality of spring pins 224 is used to electrically couple top package 222 to multiple contact pads 186 and allow electrical communication between the two packages.

PoP 220 with contact pads 186 being formed by grooving shielding layer 180 serves a major function of partial shielding, i.e., having some components shielded while others are not. Having a top package 222 without a shielding layer allows components that should not be shielded to be placed above bottom package 150 while bottom package 150 remains nearly totally shielded. Components that should remain unshielded, e.g., antennae, can be placed above shielding layer 180 in top package 222. Shielding layer 180 exists between top package 222 and bottom package 150 to protect the two packages from EMI emitted by each other.

FIG. 6*b* illustrates a PoP 230 with top package 232 coupled to contact pads 186 by solder bumps 234. Solder bumps 234 function to allow electrical communication between components in packages 150 and 232, similarly to spring pins 224. However, solder bumps 234 are reflowed between package 232 and contact pad 186 to establish a more fixed mechanical and electrical connection. Multiple rows of conductive vias 178, contact pads 186, and solder bumps 234 can be used to mount top package 232 in a traditional ball-grid array arrangement.

FIG. 6c shows a stacked package 240 with bottom package 242 being constructed similarly to semiconductor package 150 but with two rows of conductive pillars 178a and 178b and two corresponding rows of contact pads 186a and 186b. A bare semiconductor die 104c is directly mounted to contact pads 186. The multiple rows of vias 178 and contact pads 186 can be formed further apart to allow a larger die or package to be mounted onto bottom package 242.

Figure 7A:
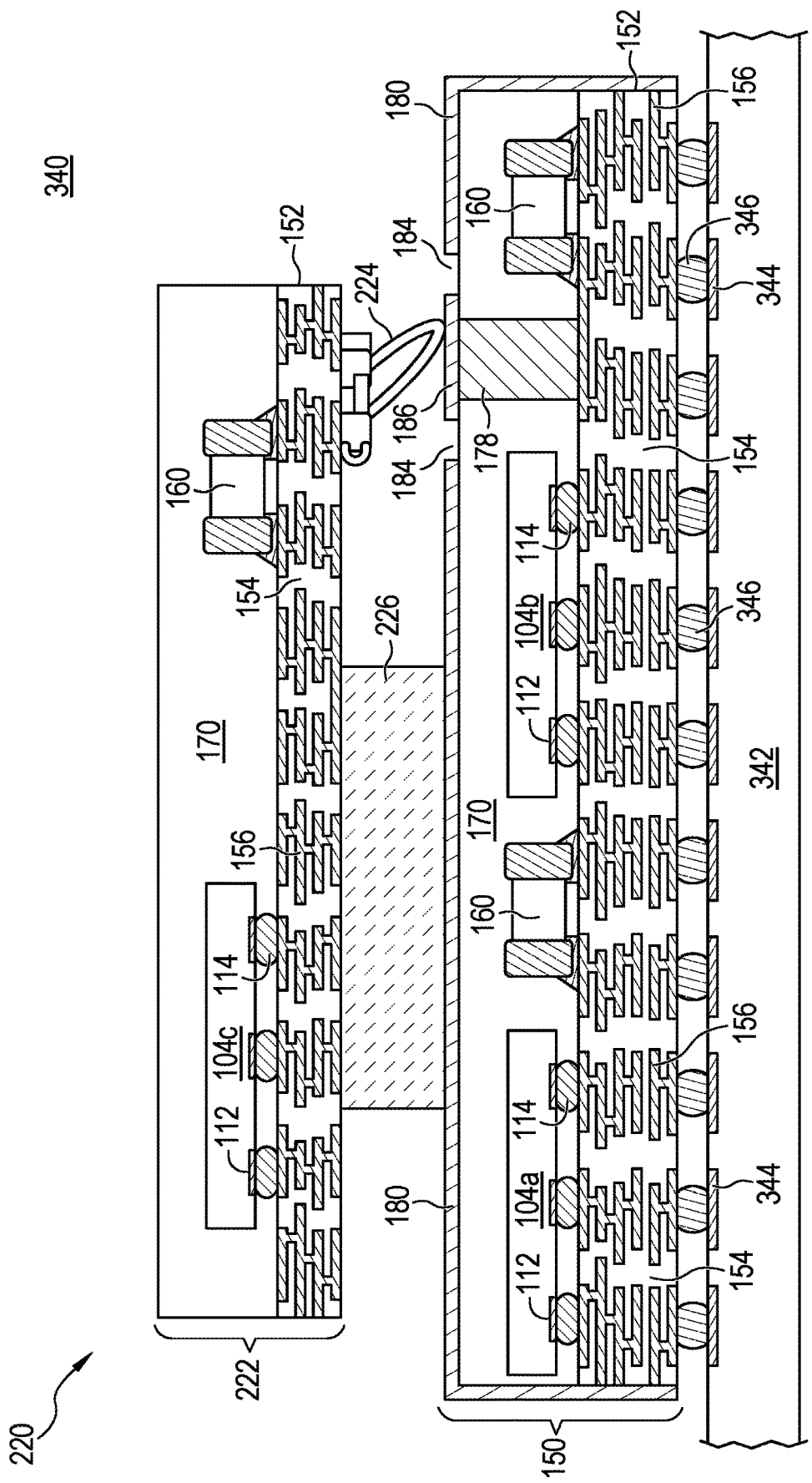
FIGS. 7a and 7b illustrate an electronic device with the stacked semiconductor packages.
Figure 7B:
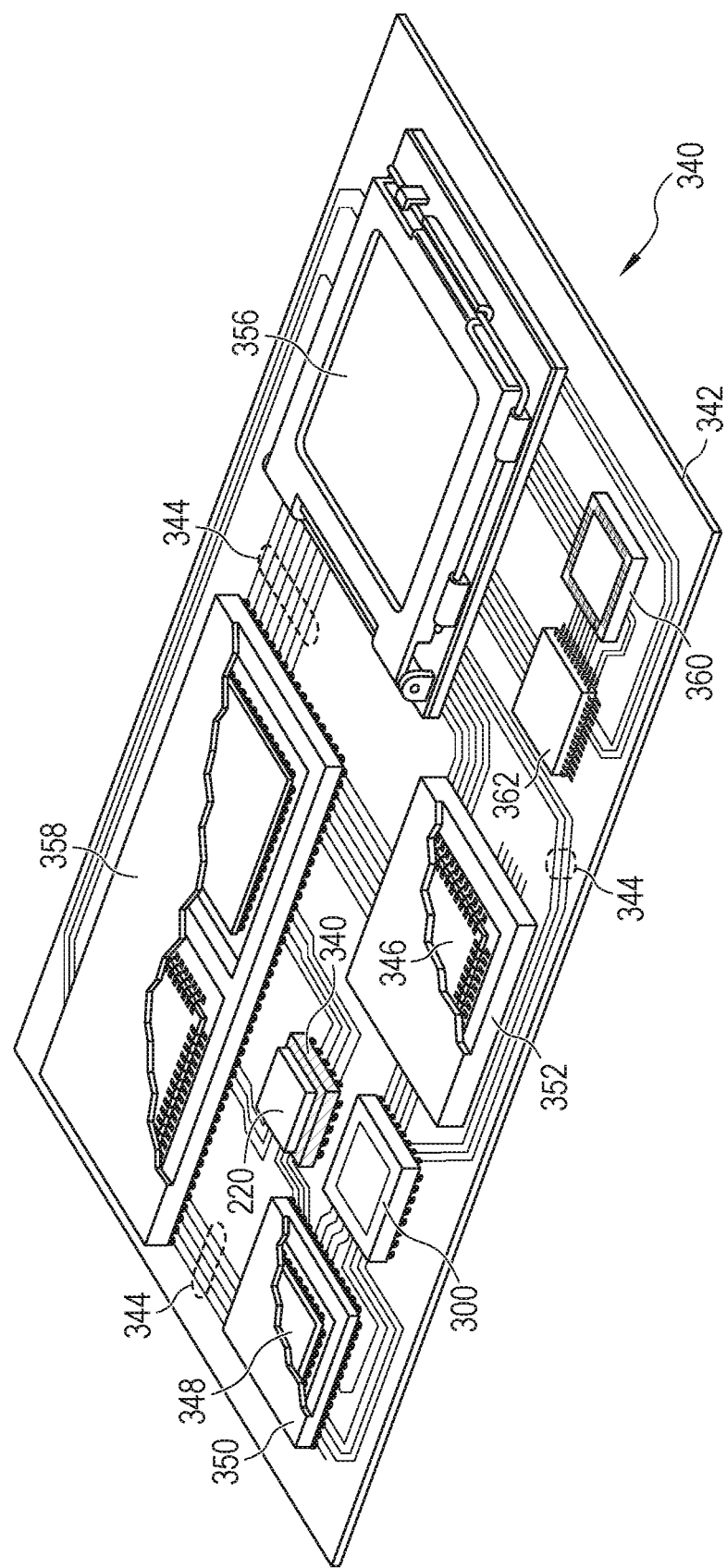

FIGS. 7a and 7b illustrate integrating the above-described semiconductor packages, e.g., PoP 220, into a larger electronic device 340. FIG. 7a illustrates a partial cross-section of PoP 220 mounted onto a printed circuit board (PCB) or other substrate 342 as part of electronic device 340. Bumps 346 are formed similarly to the description of bumps 114 above at any desired stage of manufacture and are reflowed onto conductive layer 344 of PCB 342 to physically attach and electrically connect semiconductor package 150 to the PCB. In other embodiments, thermocompression or other suitable attachment and connection methods are used. In some embodiments, an adhesive or underfill layer is used between PoP 220 and PCB 342. Semiconductor die 104 from top package 222 and bottom package 150 are each electrically coupled to conductive layer 344 through bumps 346.

FIG. 7b illustrates electronic device 340 including PCB 342 with a plurality of semiconductor packages mounted on a surface of the PCB, including PoP 220. Electronic device 340 can have one type of semiconductor package, or multiple types of semiconductor packages, depending on the application. Electronic device 340 can be a stand-alone system that uses the semiconductor packages to perform one or more electrical functions. Alternatively, electronic device 340 can be a subcomponent of a larger system. For example, electronic device 340 can be part of a tablet computer, cellular phone, digital camera, communication system, or other electronic device. Electronic device 340 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 7b, PCB 342 provides a general substrate for structural support and electrical interconnection of the semiconductor packages mounted on the PCB. Conductive signal traces 344 are formed over a surface or within layers of PCB 342 using evaporation, electrolytic plating, electroless plating, screen printing, or other suitable metal deposition process. Signal traces 344 provide for electrical communication between the semiconductor packages, mounted components, and other external systems or components. Traces 344 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 342. In other embodiments, a semiconductor device may only have the first level packaging where the die is mechanically and electrically mounted directly to PCB 342.

For the purpose of illustration, several types of first level packaging, including bond wire package 346 and flipchip 348, are shown on PCB 342. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 342 along with PoP 220. Conductive traces 344 electrically couple the various packages and components disposed on PCB 342 to PoP 220, giving use of the components within PoP 220 to other components on the PCB.

Depending upon the system requirements, any combination of semiconductor packages, configured with any combination of first and second level packaging styles, as well as other electronic components, can be connected to PCB 342. In some embodiments, electronic device 340 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   disposing an electrical component over the substrate;
   depositing an encapsulant over the electrical component;
   disposing a vertical interconnect structure in the encapsulant;
   forming a shielding layer over the encapsulant and vertical interconnect structure;
   forming a groove in the shielding layer around the vertical interconnect structure, wherein a portion of the shielding layer remains over the vertical interconnect structure as a contact pad;
   mounting a semiconductor package to the shielding layer using an adhesive standoff with a spring pin of the semiconductor package contacting the contact pad.

2. The method of claim 1, further including forming the vertical interconnect structure by:
   forming an opening through the encapsulant; and
   depositing a conductive material into the opening.

3. The method of claim 1, further including disposing the vertical interconnect structure over the substrate prior to depositing the encapsulant.

4. The method of claim 3, wherein the vertical interconnect structure is a PCB unit.

5. The method of claim 1, further including singulating the substrate and encapsulant prior to forming the shielding layer.

6. A method of making a semiconductor device, comprising:

providing a first semiconductor package including a substrate, a vertical interconnect structure disposed over the substrate, and an encapsulant deposited over the substrate;

forming a shielding layer over the encapsulant and vertical interconnect structure;

forming a groove in the shielding layer around the vertical interconnect structure, wherein the groove extends continuously around a first portion of the shielding layer over the vertical interconnect structure; and mounting a semiconductor package to the shielding layer using an adhesive with a spring pin of the semiconductor package contacting the first portion of the shielding layer.

7. The method of claim 6, wherein the vertical interconnect structure is a conductive via or conductive pillar.

8. The method of claim 6, wherein the vertical interconnect structure is a PCB unit.

9. The method of claim 6, wherein the vertical interconnect structure is a connector.

10. The method of claim 6, wherein the vertical interconnect structure extends from the substrate to the shielding layer.

11. A method of making a semiconductor device, comprising:

providing a first semiconductor package including a substrate, a vertical interconnect structure disposed over the substrate, an encapsulant deposited over the substrate, and a shielding layer formed over the encapsulant;

forming a groove in the shielding layer around the vertical interconnect structure, wherein the groove extends continuously around a first portion of the shielding layer over the vertical interconnect structure; and disposing a second semiconductor package over the first semiconductor package with a spring pin of the second semiconductor package contacting the first portion of the shielding layer.

12. The method of claim 11, wherein the vertical interconnect structure is a connector.

13. The method of claim 11, wherein the vertical interconnect structure extends from the substrate to the shielding layer.

14. A method of making a semiconductor device, comprising:

providing a substrate;

disposing a vertical interconnect structure over the substrate;

depositing an encapsulant over the substrate;

forming a shielding layer over the encapsulant, wherein the shielding layer includes a groove around the vertical interconnect structure; and disposing semiconductor package over the shielding layer with an interconnect structure of the semiconductor package contacting the shielding layer within the groove.

15. The method of claim 14, wherein the vertical interconnect structure is a connector.

16. The method of claim 14, wherein the vertical interconnect structure extends from the substrate to the shielding layer.

17. The method of claim 14, wherein the groove extends completely around the vertical interconnect structure in plan view.

* * * * *